US009537076B2

(12) United States Patent
Suda et al.

(10) Patent No.: US 9,537,076 B2
(45) Date of Patent: Jan. 3, 2017

(54) THERMOELECTRIC CONVERSION MODULE (71) Applicant: NIPPON THERMOSTAT CO., LTD., Kiyose-shi, Tokyo (JP)

(72) Inventors: Hiroshi Suda, Tokyo (JP); Junichi Sato, Tokyo (JP)

(73) Assignee: Nippon Thermostat Co., Ltd. (JP)

( * ) Notice: Subject to any disclaimer, the term of this patent is extended or adjusted under 35 U.S.C. 154(b) by 13 days.

(21) Appl. No.: 14/766,744

(22) PCT Filed: Dec. 10, 2013

(86) PCT No.: PCT/JP2013/083011
§ 371 (c)(1),
(2) Date: Aug. 8, 2015

(87) PCT Pub. No.: WO2014/141551
PCT Pub. Date: Sep. 18, 2014

(65) Prior Publication Data
US 2016/0005947 A1 Jan. 7, 2016

(30) Foreign Application Priority Data

Mar. 15, 2013 (JP) ................. 2013-053768

(51) Int. Cl.
*H01L 35/32* (2006.01)
*H01L 35/16* (2006.01)

(52) U.S. Cl.
CPC .............. *H01L 35/32* (2013.01); *H01L 35/16* (2013.01)

(58) Field of Classification Search
CPC ..................................................... H01L 35/32
(Continued)

(56) References Cited

U.S. PATENT DOCUMENTS 3,607,444 A * 9/1971 DeBucs ................. F25B 21/02
136/208
3,617,390 A * 11/1971 De Bucs ................. H01L 35/30
136/204
(Continued)

FOREIGN PATENT DOCUMENTS

JP       H08149866 A    6/1996
JP       2004152921 A   5/2004
(Continued)

OTHER PUBLICATIONS

International Preliminary Report for PCT/JP2013/083011 dated Sep. 15, 2015.
(Continued)

*Primary Examiner* — Golam Mowla
(74) *Attorney, Agent, or Firm* — Lerner, David, Littenberg, Krumholz & Mentlik, LLP (57) ABSTRACT A thermoelectric conversion module has a substrate, a plurality of first electrodes, a plurality of thermoelectric conversion elements 2, a plurality of second electrodes 4, and connectors 42. The plurality of thermoelectric conversion elements 2 are n-type elements, connected in series. The connector 42 is formed as a single unit with the second electrodes 4 and separate from the first electrodes 3. A receptor 33 that accepts the tip of the connector 42 is provided to each of the first electrodes 3. Six element rows 6 of five thermoelectric conversion elements 2 aligned along the X axis are arrayed along the Y axis. The receptors 33 are configured to accept connectors 42 of the same shape whether electrically connecting the thermoelectric conversion elements 2 within the element rows 6 or electrically connecting between adjacent element rows 6. The first electrodes 3 and second electrodes 4 are all the same shape.

4 Claims, 4 Drawing Sheets (58) Field of Classification Search
USPC .............. 136/212, 205, 203; 62/3.2, 3.3
See application file for complete search history.

(56) References Cited

U.S. PATENT DOCUMENTS

| | | | | |
|---|---|---|---|---|
| 3,714,539 A * | 1/1973 | Hampl, Jr. | ............ | H01L 35/06 |
| | | | | 136/205 |
| 3,884,726 A * | 5/1975 | Landecker | ............ | H01L 35/325 |
| | | | | 136/203 |
| 4,497,973 A * | 2/1985 | Heath | ............ | H01L 35/32 |
| | | | | 136/205 |
| 2003/0033818 A1* | 2/2003 | Kucherov | ............ | F25B 21/02 |
| | | | | 62/3.1 |
| 2005/0155642 A1* | 7/2005 | Chen | ............ | H01L 35/30 |
| | | | | 136/252 |
| 2007/0095381 A1* | 5/2007 | Lee | ............ | H01L 27/16 |
| | | | | 136/230 |
| 2009/0277489 A1 | 11/2009 | Dannoux et al. | | |
| 2010/0154854 A1 | 6/2010 | Lee et al. | | |
| 2010/0288325 A1* | 11/2010 | Takahashi | ............ | H01L 35/32 |
| | | | | 136/205 |
| 2011/0139203 A1* | 6/2011 | Yap | ............ | H01L 35/30 |
| | | | | 136/205 |
| 2012/0000500 A1* | 1/2012 | Iida | ............ | H01L 35/08 |
| | | | | 136/200 |

FOREIGN PATENT DOCUMENTS

| | | |
|---|---|---|
| JP | 4834986 B | 6/2006 |
| JP | 2009-176919 A | 8/2009 |
| JP | 2010171071 A | 8/2010 |
| JP | 2013080719 A | 5/2013 |
| WO | 2005124881 A1 | 12/2005 |
| WO | 2006004059 A1 | 1/2006 |
| WO | 2008029451 A1 | 3/2008 |
| WO | 2012091048 A1 | 7/2012 |

OTHER PUBLICATIONS

International Search Report for PCT/JP2013/083011 dated Feb. 10, 2014.

* cited by examiner

THERMOELECTRIC CONVERSION MODULE

TECHNICAL FIELD

The present invention relates to a thermoelectric conversion module that uses the Seebeck effect to generate electricity and the Peltier effect to carry out cooling and heating.

BACKGROUND ART

Conventionally, a thermoelectric conversion module is known in which a plurality of thermoelectric conversion elements, each having an electrode at both ends, are disposed on a substrate (see, for example, Patent Document No. 1).

The thermoelectric conversion module of Patent Document No. 1 is configured as a so-called pi-leg thermoelectric conversion module, in which two types of thermoelectric conversion elements, n-type thermoelectric conversion elements and p-type thermoelectric conversion elements, are disposed in an alternating arrangement and connected electrically in series.

In the thermoelectric conversion module of Patent Document No. 1, the hot side of the thermoelectric conversion module is disposed not in contact with a heat chamber inside an ohmic-resistance heater covered with thermal insulation material, such that, on the hot side, the thermoelectric conversion module is subjected to radiant heat transfer from the heat chamber. Therefore, in the thermoelectric conversion module of Patent Document No. 1, the base that functions as the insulation on the hot side is eliminated. If the ohmic-resistance heater is contacted against the heat chamber inside the ohmic-resistance heater, a substrate configured as insulation is provided.

Further, a so-called uni-leg, configured of only one type of thermoelectric conversion element, whether n-type or p-type, is also known (see, for example, Patent Document No. 2).

The thermoelectric conversion module of Patent Document No. 2 has a connector that integrally and electrically connects in series one electrode of one thermoelectric conversion element and the other electrode of an adjacent thermoelectric conversion element, such that the two electrodes and the connector for a U-shaped connector. The U-shaped connector is formed by bending a metal plate. When the thermoelectric conversion module is manufactured, a fixed number of U-shaped connectors are fixedly mounted on the substrate. Then, the thermoelectric conversion elements are inserted between two electrodes so that the U-shaped connectors are pushed in from the side and connected to the connectors.

PRIOR ART DOCUMENTS

Patent Documents

Patent Document 1: JP-4834986-B
Patent Document 2: JP-2009-176919-A

SUMMARY OF THE INVENTION

Technical Problem

The conventional uni-leg thermoelectric conversion module is difficult to assemble and difficult to mass-produce because the thermoelectric conversion elements must be pressed into the U-shaped connectors.

The present invention is conceived in light of this problem, and has as its object to provide a thermoelectric conversion module that is easier to mass-produce.

Solving the Technical Problem

[1] To achieve this objective, the present invention provides a thermoelectric conversion module comprising: a substrate; a plurality of first electrodes; a plurality of thermoelectric conversion elements each electrically connected at one end to the first electrodes; a plurality of second electrodes, each electrically connected at another end to the thermoelectric conversion elements; connectors that electrically connects the plurality of first electrodes electrically connected to the thermoelectric conversion elements to the second electrodes electrically connected to adjacent thermoelectric conversion elements; the plurality of thermoelectric conversion elements being either n-type or p-type thermoelectric conversion elements; and the thermoelectric conversion elements being electrically connected in series, the first electrodes each having an element alignment unit that electrically contacts one end of the thermoelectric conversion elements and a receptor that receives the connectors, either the first electrodes or the second electrodes being set on the substrate, along the substrate and alternating along two orthogonal axes, an X-axis and a Y-axis, the thermoelectric conversion elements forming a plurality of element rows on the substrate aligned with the X-axis, the plurality of element rows aligned with the Y-axis, the receptors positioned on the X-axis of the element alignment unit within the element rows and configured to accept the connectors of the same shape whether electrically connecting the thermoelectric conversion elements within the element rows or electrically connecting between the element rows that are adjacent to each other, the first electrodes all having the same shape, the second electrodes all having the same shape.

With the present invention, the connectors are formed as a single unit with the second electrodes and are separate from the first electrodes. As a result, after setting the thermoelectric conversion elements on the first electrodes or the second electrodes, and connecting the remaining electrodes to the thermoelectric conversion elements, the thermoelectric conversion module can be assembled with ease, thereby providing a thermoelectric conversion module that can be assembled easily while keeping down an increase in the number of components.

[2] Further, in the present invention, the receptor has a plurality of holes formed therein, a center hole of the plurality of holes accepting the connectors within the element rows, and left and right holes accepting the connector between the element rows.

[3] Further, in the present invention, the first electrode has an extension that extends along the substrate from the element alignment unit, the receptor is provided to the extension, and the first electrode has a mistaken assembly prevention unit configured of a convexity and a concavity to prevent mistaken setting on the substrate.

As a result, according to the present invention, mistaken setting of the first electrode on the substrate can be prevented, thereby improving yields.

[4] Further, the present invention provides a method of assembling a thermoelectric conversion module, comprising setting an alignment unit having a plurality of notched holes corresponding in position and shape to the plurality of first electrodes on the substrate; and fitting the first electrodes into the notched holes to set the first electrode on the substrate.

According to the above-described method of assembly, a portion corresponding to the mistaken assembly prevention unit of the first electrode is also provided to the notched holes in the alignment member, so that, even if it is mistakenly attempted to set the first electrodes on the substrate, the mistaken assembly prevention unit and the corresponding notched holes portion form an obstruction and the first electrode cannot be fitted into the cutout in the alignment member. As a result, according to the present invention, mistaken setting of the first electrode on the substrate can be prevented, thereby improving yields.

DETAILED DESCRIPTION OF EMBODIMENTS OF THE INVENTION

Figure 1:
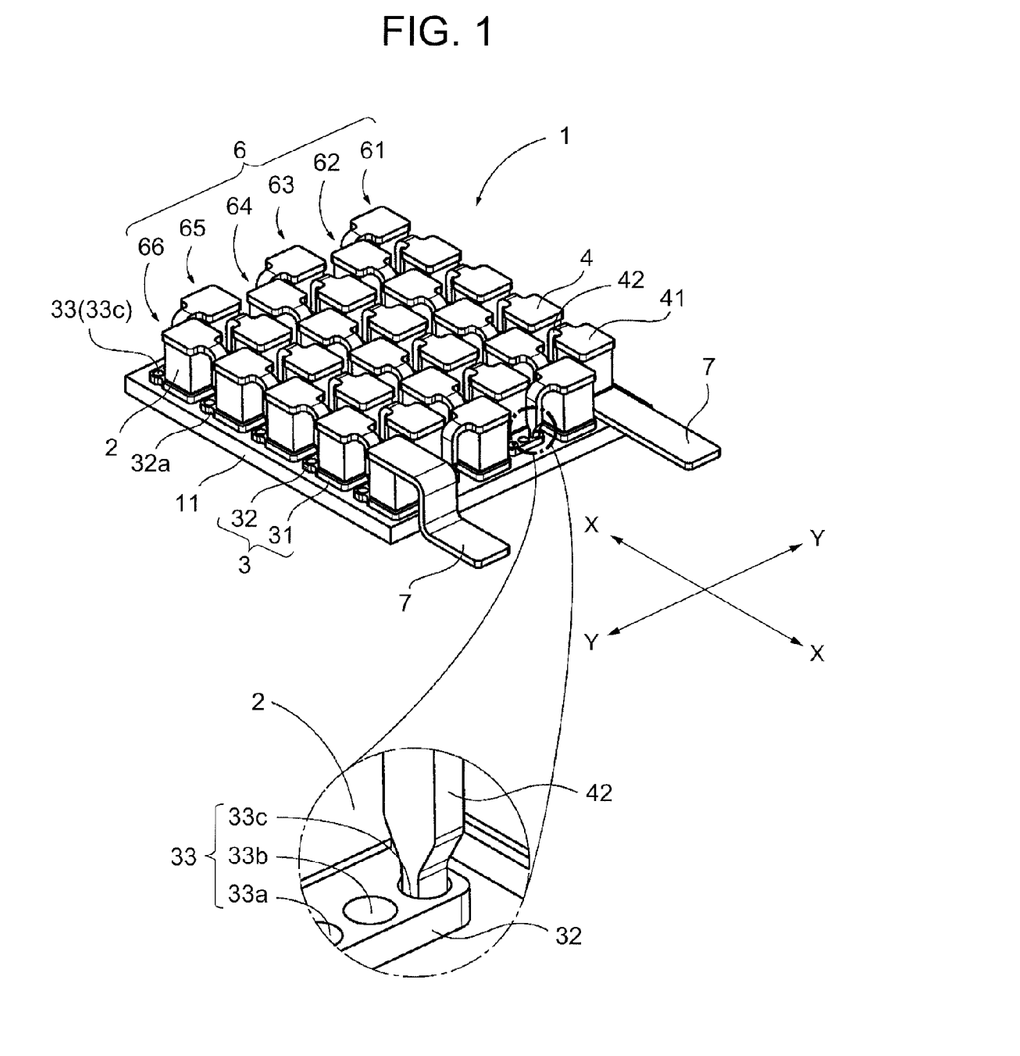
FIG. 1 is a perspective view of an expanded portion of an embodiment of a thermoelectric conversion module of the present invention.
Figure 2:
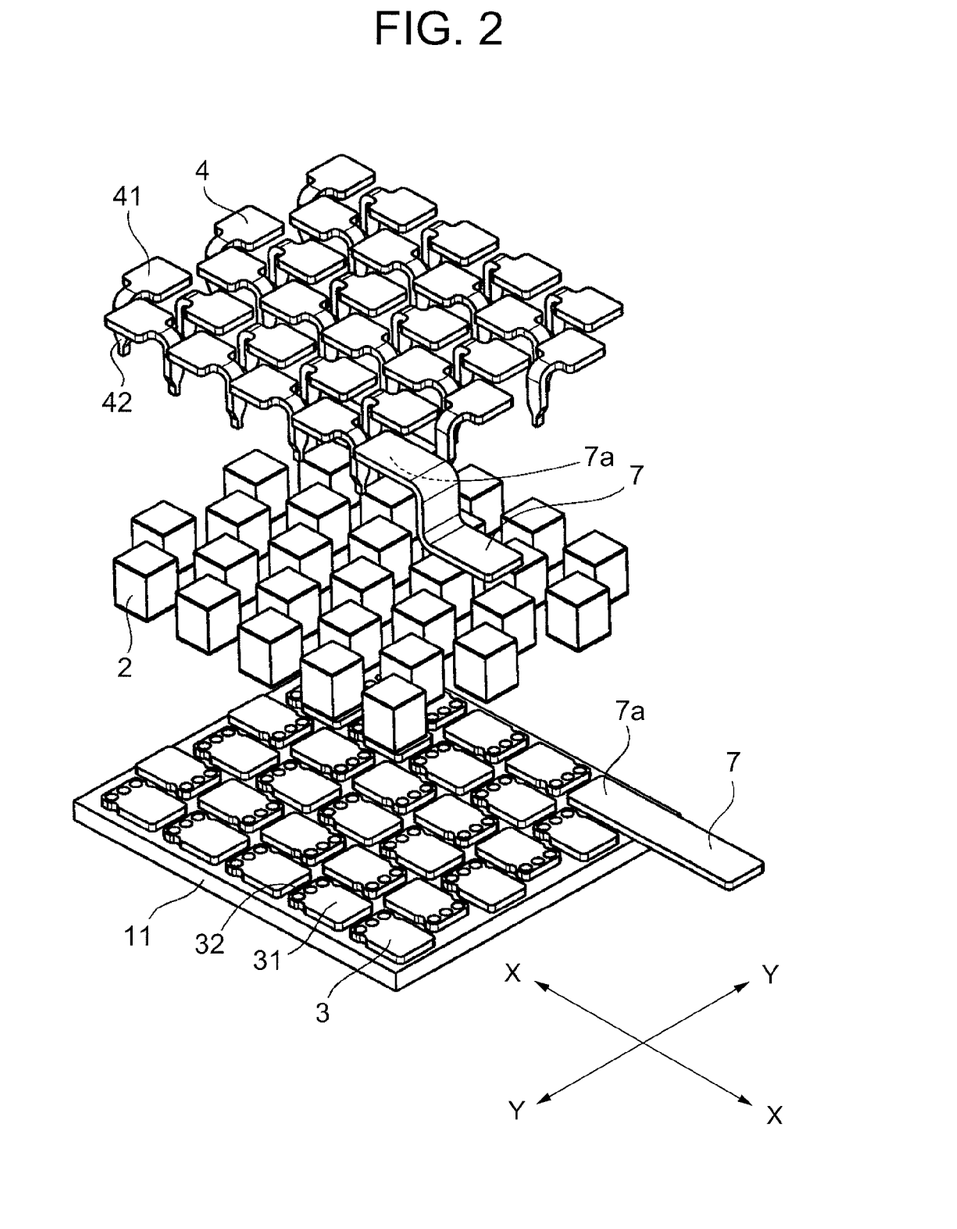
FIG. 2 is an exploded perspective view of the thermoelectric conversion module of the present invention.
Figure 3:
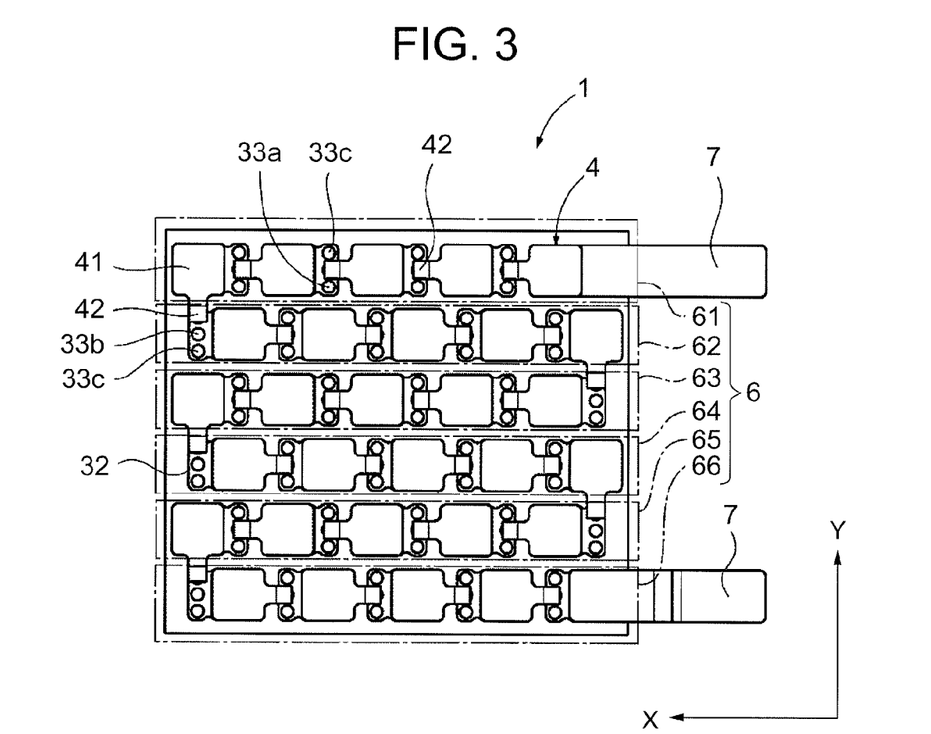
FIG. 3 is a plan view of the thermoelectric conversion module of the present invention.

With reference to FIG. 1 to FIG. 6, a description is now given of an embodiment of a thermoelectric conversion module of the present invention. A first embodiment of a thermoelectric conversion module 1 shown in FIG. 1 through FIG. 3 is a so-called uni-leg type, in which a plurality of n-type thermoelectric conversion elements are electrically connected in series, with a pair of planar substrates 11 having insulating properties and made of aluminum oxide. The substrate located on top has been removed in FIGS. 1 through 3 in order to provide a clearer view of the interior of the thermoelectric conversion module 1. It is to be noted that although the substrate located on top in FIG. 1 is necessary in order to prevent short-circuiting when the thermoelectric conversion module 1 is used in contact with a heat source having an electrically conductive coating such as metal, the substrate located on top can be eliminated in a case in which the heat source is insulated or the device is configured so that the thermoelectric conversion module 1 is not contacted against the heat source but is subjected to radiant heat transfer from the heat chamber. Moreover, the material of the substrate can be changed as needed depending on the heat source. For example, the top substrate can be configured as an insulating heat conduction sheet. Alternatively, the thermoelectric conversion module 1 can also be configured keeping only the top substrate and eliminating a bottom substrate 11.

A plurality of first electrodes 3 and second electrodes 4 made of nickel plate are provided on the opposed surfaces of the two substrates 11, that is, the surfaces facing each other. A plurality of $Mg_2Si$ n-type thermoelectric conversion elements 2 is disposed between the two electrodes 3, 4.

Conventionally, BiTe (bismuth telluride), PbTe (lead telluride), and CoSb (cobalt antimony) have been used as the material for the thermoelectric conversion module. However, all of these are toxic to humans (including substances that may be harmful) and costly. By contrast, $Mg_2Si$ is non-toxic to humans and does not burden the environment, and moreover is plentiful and cheap. In addition, $Mg_2Si$ has a light specific gravity, allowing extremely light thermoelectric conversion elements 2 to be fabricated. For these reasons $Mg_2Si$ has recently become the material of choice for thermoelectric conversion elements.

It should be noted that the material for the two substrates 11 is not limited to aluminum oxide and may instead be other materials. In addition, the electrodes 3, 4 need not be formed of nickel (Ni) but may instead be formed of other materials such as nickel-plated copper (Cu).

One end of the thermoelectric conversion elements 2 is joined to the first electrodes 3 and the other end is joined to the second electrodes 4. The method by which they are joined may be soldering, brazing, or adhesion or diffusion bonding using an electroconductive adhesive such as silver paste. The exact method of joining may be selected as needed depending on the application for which the thermoelectric conversion module is intended.

In a case in which the joining is by brazing, the filler metal (solder) may be pre-pasted on the two ends of the thermoelectric conversion element 2. The surface of the thermoelectric conversion elements 2 consists of minute concavities and convexities, but this uneven surface can be made smooth by covering these concavities and convexities in the surface with filler metal (solder) or silver paste, resulting in good joining between the thermoelectric conversion elements 2 and the electrodes 3, 4 and providing superior electrical conductivity. Moreover, when fabricating the thermoelectric conversion elements 2, a nickel film may be formed on both ends of the thermoelectric conversion elements 2.

Figure 4:
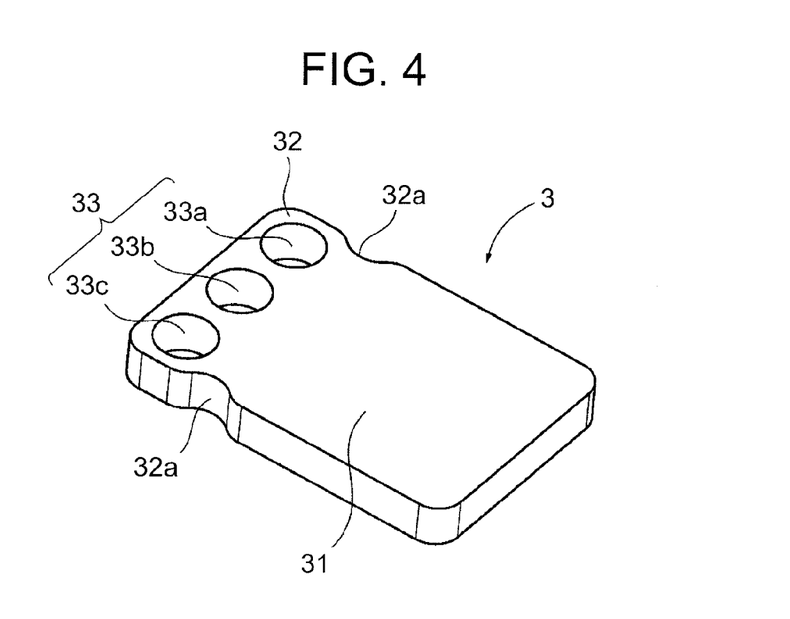
FIG. 4 is a perspective view of the first electrodes of the present embodiment.
Figure 5:
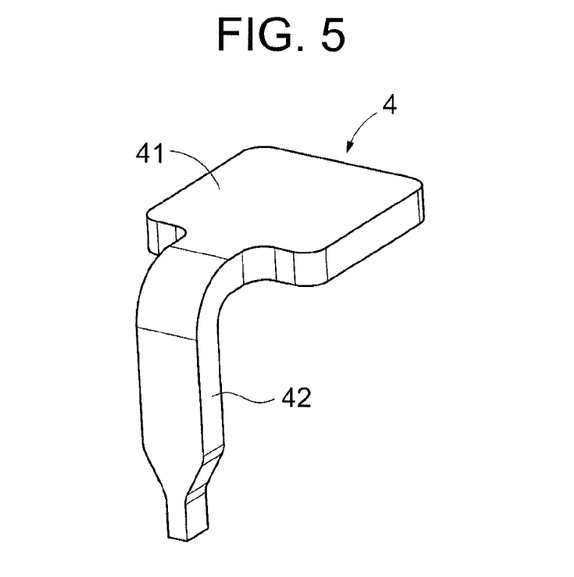
FIG. 5 is a perspective view of the second electrodes of the present embodiment.

As shown in FIG. 4, the first electrodes 3 have an element alignment unit 31 that aligns the thermoelectric conversion elements 2 and an extension portion 32 extending from and continuous with the element alignment unit 31 along the substrate 11. In short, the element alignment unit 31 is electrically connected to the one end of the thermoelectric conversion elements 2. Similarly, as shown in FIG. 5, the second electrodes 4 have an element alignment unit 41 that aligns the thermoelectric conversion elements 2 and a rectangular connector 42 extending from and continuous with one side of the element alignment unit 41 and bent, L-shaped, at a right angle to the element alignment unit 41. In short, the element alignment unit 41 is electrically connected to the other end of the thermoelectric conversion elements 2.

Three holes, 33a, 33b, and 33c, are formed in the extension portions 32 of the first electrodes 3, into which the tip of the connector 42 is inserted. In the present embodiment, these three holes, 33a, 33b, and 33c, form a receptor 33. The tip of the connector 42 is inserted in the receptor 33 provided to the first electrode 3 and joined thereto by brazing or the like. By so doing, the first electrodes 3 and the second electrodes 4 provided to the thermoelectric conversion element adjacent to the thermoelectric conversion element 2 to which the first electrode is provided are electrically connected in series. Note that, as with the electrodes 3, 4, nickel (Ni) is used for the connectors 42. However, the material for the connectors 42 is not limited thereto, and alternatively other metals may be used, such as nickel-plated copper (Cu).

The surface of the substrate 11 may be thought of as being bisected by two orthogonal axes, an X-axis and a Y-axis. In FIG. 3, the horizontal direction is the X-axis and the vertical direction is the Y-axis. The thermoelectric conversion elements 2 are arrayed in rows 6 of multiple elements (5 in the drawing) along the X-axis. In turn, there are multiple rows 6 of thermoelectric conversion elements (6 in the drawing). In the drawing, one thermoelectric conversion module 1 is composed of 30 thermoelectric conversion elements 2.

An electrical input/output terminal 7 is provided on one end of the thermoelectric conversion element 2 located on the far right end of the topmost element row 6 in FIG. 3. The terminal 7 is formed in the shape of a rectangle protruding well outside the substrate 11 from the element alignment unit 7a on which the thermoelectric conversion elements 2 are arrayed.

Similarly, an electrical input/output terminal 7 is provided on the other end of the thermoelectric conversion element 2 located on the far right end of the bottommost element row 6 in FIG. 3. The terminal 7 is formed in the shape of a rectangle protruding well outside the substrate 11 from the element alignment unit 7a on which the thermoelectric conversion elements 2 are disposed, and is bent in the shape of a crank. The right edge of the terminal 7 in FIG. 3 is set at the same height as the terminal 7 at the topmost element row 6.

It should be noted that although in the present embodiment there is an even number of element rows 6, alternatively the thermoelectric conversion module 1 may be configured with an odd number of rows. In a case in which the thermoelectric conversion module 1 is configured with an odd number of rows, for example, the terminal 7 provided to the topmost element row 6 in FIG. 3 may be provided instead to the first electrode 3 located on the left.

Figure 6:
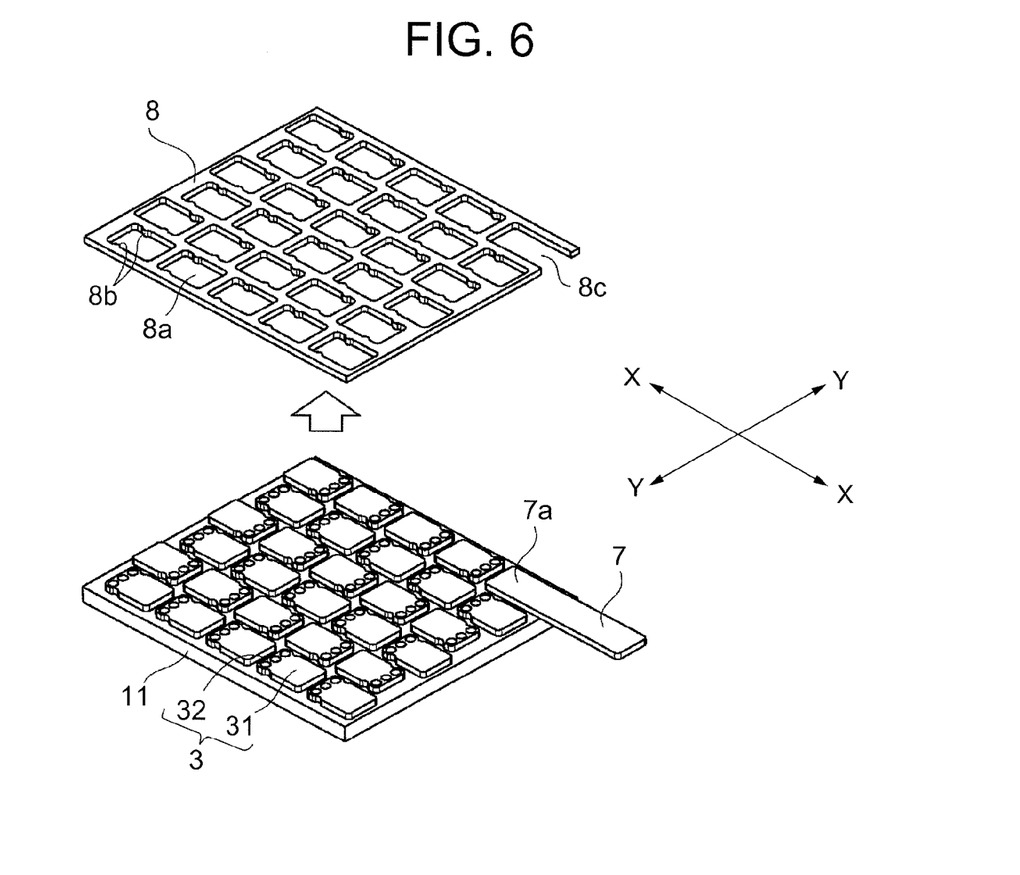
FIG. 6 is an explanatory diagram illustrating a method of assembling the thermoelectric conversion module of the present embodiment, showing a step in which the first electrodes are set on the substrate using an alignment member and the alignment member is then lifted up and off.

As shown in FIG. 4, a concave portion 32a is provided on both left and right lateral edges of the extension portion 32, and used when positioning the first electrode 3 on the substrate 11. More specifically, when positioning the first electrode 3 on the substrate 11, an alignment member 8 shown in FIG. 6 is used. As shown in FIG. 6, a notched holes 8a corresponding in position and shape to the plurality of first electrodes 3 are provided in the alignment member 8.

During assembly of the thermoelectric conversion module 1, when positioning the first electrode 3 on the substrate 11, first, the alignment member 8 is set on the substrate. Then, the first electrodes 3 are fitted into the notched holes 8a.

Convex portions 8b corresponding to the concave portions 32a provided to the first electrodes 3 are formed in the notched holes 8a. Therefore, even if an attempt is made to fit the first electrodes 3 into the notched holes 8a with the extension portion 32 in the wrong position relative to the element alignment unit 31, the concave portions 32a and the convex portions 8b are misaligned and the convex portions 8b form an obstacle that prevents the first electrodes from being fitted into the notched holes 8a. As a result, the thermoelectric conversion module 1 of the present embodiment can prevent mistaken setting of the first electrode 3 on the substrate 11, thereby improving yields. Moreover, a cutout 8c is provided to the alignment member 8 used in the assembly method of the thermoelectric conversion module 1 of the present embodiment to enable the terminals 7 to be aligned as well.

Although it is conceivable to provide concave portions to both left and right lateral edges of the element alignment unit 31, such a configuration reduces the area of contact between the element alignment unit 31 and the thermoelectric conversion module 2. Providing the concave portions 32a to the extension as described above can prevent mistaken setting of the first electrode 3 on the substrate 11 without reducing the area of placement of the thermoelectric conversion elements 2.

In addition, convex portions may be formed on both left and right lateral edges of the extension portion 32 of the first electrode 3, and concave portions corresponding to the convex portions of the notched holes 8a. In that case, convex portions can be provided to the edges of the element alignment unit 31. In addition, the concave portions or the convex portions of the extension portion 32 may be formed on the tip of the extension portion 32 (the edge away from the element alignment unit 31), in which case, for example, only one of a convex portion or a concave portion need be provided at the center thereof, or two may be provided to position the extension portion 32 laterally between the holes.

In FIG. 3, the individual element rows 6, from top to bottom, form a first element row 61, a second element row 62, a third element row 63, a fourth element row 64, a fifth element row 65, and a sixth element row 66, with the first element row 61, the third element row 63, and the fifth element row 65 forming odd-numbered rows and the second element row 62, the fourth element row 64, and the sixth element row 66 form even-numbered rows.

The first electrodes 3 of the odd-numbered rows 61, 63, and 65, as shown in FIG. 3, are lined up so that the extension portion 32 is located on the right side of the element arrangement unit 31. By contrast, the first electrodes 3 of the even-numbered rows 62, 64, and 66, as shown in FIG. 3, are lined up so that the extension portion 32 is located on the left side of the element arrangement unit 31. In short, in the thermoelectric conversion module 1 of the present embodiment, all the extensions are located along the X-axis of the element alignment unit 31.

The odd-numbered rows 61, 63, and 65 of the second electrodes 4, except for the second electrodes 4 on the extreme left, are arranged so that the connectors 42 are located on the left side of the element alignment unit 41. The tips of the connectors 42 are inserted in the hole 33b located in the center of the receptor 33 and joined thereto by brazing or the like. By contrast, the even-numbered rows 62, 64, and 66 of the second electrode 4, except for the second electrodes 4 on the extreme right, are arranged so that the connectors 42 are located on the right side of the element alignment unit 41. The tips of the connectors 42 are inserted in the hole 33b located in the center of the receptor 33.

The second electrodes 4 located on the extreme left in the odd-numbered rows 61, 63, and 65 of the second electrodes 4 are for electrically connecting serially between element rows 6. In FIG. 3, the connectors 42 are arranged so as to be positioned on the bottom side of the element alignment unit 41. The tips of the connectors 42 are then inserted in the hole 33a located on the right in the receptor 33, and joined thereto by brazing or the like.

Of the even-numbered rows, the second terminal row 62 to which no terminal 7 is provided and the second electrode 4 located on the extreme right in the fourth element row 64 terminal are for electrically connecting serially between element rows 6. In FIG. 3, the connectors 42 are arranged so as to be positioned on the bottom side of the element alignment unit 41. The tips of the connectors 42 are then inserted in the hole 33a located on the left in the receptor 33, and joined thereto by brazing or the like.

Thus, as described above, within element rows 6 the connectors 42 are inserted into the middle hole 33b while between element rows 6 the connectors 42 are inserted in left and right holes 33*a*, 33*c*. As a result, elements can be electrically connected within element rows 6 and between element rows 6 using connectors 42 of the same shape, without changing the shape of the connectors 42.

Therefore, compared to a module in which both electrodes and the connectors are separate, the thermoelectric conversion module 1 of the present embodiment holds down any increase in the number of components and makes module manufacture easier than is conventionally the case.

Moreover, the first electrodes 3 are formed to have a laterally symmetrical shape, with a receptor configured with three holes 33*a*, 33*b*, and 33*c*. As a result, all the first electrodes 3 can be formed to the same shape. In addition, since the first electrodes 3 have a laterally symmetrical shape, they have no front or back, thus further simplifying assembly.

Conceivably, the first electrodes 3 could be arrayed so that only the first electrodes 3 in the even-numbered rows 62, 64, and 66 located on the extreme left in FIG. 3 are positioned with the extension 32 on top of the element alignment unit 31, and only the first electrodes 3 in the odd-numbered rows 63 and 65 located on the extreme right in FIG. 3 are positioned with the extension 32 on top of the element alignment unit 31.

However, with such a configuration it is necessary to open a space for the extension 32 between element rows 61-66, thereby reducing the element density of the thermoelectric conversion module 1. With the thermoelectric conversion module 1 of the present invention all of the first electrodes 3 and the extensions 32 can be aligned in the X-axis direction of the element alignment unit 31, thus improving element density.

It should be noted that although in the present embodiment the receptor 33 is described as having three holes, 33*a*, 33*b*, and 33*c*, the receptor according to the present invention is not limited thereto. For example, the receptor may be configured with a single hole elongated in the lateral direction, or configured with the center and right holes 33*a*, 33*b* and eliminating the left hole 33*c*. If the receptor is configured with the two holes 33*a*, 33*b*, the first electrodes 3 may be flipped upside down so that the connector 42 extending from the adjacent element row 6 can be fitted into the right hole 33*a*.

Although the thermoelectric conversion elements 2 of the present embodiment are depicted as square blocks in FIG. 2, they are not limited thereto and may instead be cylinders, for example.

Next, a description is given of the operation of the thermoelectric conversion module of the present embodiment.

If the top substrate (not shown) of the thermoelectric conversion module 1 is mounted to a heat source of, for example, 300° C. to 600° C., and the substrate 11 is cooled, a temperature difference is created between the two ends of the thermoelectric conversion elements 2 and an electric current begins to flow due to the Seebeck effect, generating electricity. At this time, in order to continue to generate electricity, it is necessary to continue to maintain a predetermined temperature difference between the two ends of the thermoelectric conversion elements 2. However, in the first embodiment, the material used for the thermoelectric conversion elements 2 is $Mg_2Si$, and so good maintenance of a temperature difference can be achieved.

With the thermoelectric conversion module 1 of the first embodiment, the connectors 42 are formed as a single unit with the second electrodes 4 and are separate from the first electrodes 3. As a result, after electrically connecting one end of the thermoelectric conversion elements 2 to the first electrodes 3 fixedly mounted on the substrate 11, the second electrodes 4 are electrically connected to the other end of the thermoelectric conversion elements 2 and the first electrodes 3. At the same time, the connectors 42 can be connected to the receptors 33 of the first electrodes 3 so that the second electrodes 4 are electrically connected between adjacent thermoelectric conversion elements 2. Therefore, there is no need to press the thermoelectric conversion elements into U-shaped connectors as with the conventional thermoelectric conversion module, thereby making it easier to mass-produce thermoelectric conversion modules.

Although in the first embodiment the thermoelectric conversion elements 2 are made of $Mg_2Si$, the material thereof is not limited thereto. Accordingly, the thermoelectric conversion elements 2 may be made of any photoelectric conversion material, for example, a Bi—Te compound containing an SB—Te compound and a Bi—Se compound, a Pb—Te compound containing a Sn—Te compound and a Ge—Te compound, a Ag—Sb—Te compound, a Ag—Sb—Ge—Te compound, a Si—Ge, Fe—Si compound, a Mn—Si, Zn—Sb compound, a chalcogenide, skutterudite, filled skutterudite, clathrate, half-Heusler, boron carbide, layered cobalt oxide, or the like. Moreover, the photoelectric conversion elements 2 are not limited to n-type, and p-type elements may be used. Further, the $Mg_2Si$ need not be of high purity, and may, for example, be silicon sludge ejected during cutting and polishing.

A junction layer to reduce contact resistance with the electrodes may be provided on the two ends of the photoelectric conversion elements 2. The junction layer can be formed as a single unit with the thermoelectric conversion elements. Any of Ni, Al, Cu, W, Au, Ag, Co, Mo, Cr, Ti, Pd, or an alloy of these, may be used for the junction layer and electrodes.

Although the thermoelectric conversion module 1 is described as used to generate electricity using the Seebeck effect in the foregoing embodiment, the thermoelectric conversion module of the present invention can also be similarly used to heat or to cool using the Peltier effect.

Although the concave portion 32*a* and the convex portion 8*b* shown in FIG. 6 are described as configuring a mistaken assembly prevention unit in the foregoing embodiment, the mistaken assembly prevention unit of the present invention is not limited thereto. For example, cutting a part of one of the four corners of the first electrode at a slant and providing cut portion as the concave portion of the present invention, and providing the alignment member 8 with a projecting portion (a convex portion) that corresponds to the cut portion as the concave portion of the present invention, can also prevent setting on the substrate 11 with the element alignment unit 31 and the extension 32 positioned in the wrong place.

Although in the foregoing embodiment the top of the thermoelectric conversion module 1 shown in FIG. 1 is contacted against a heat source and is the hot side, and the bottom is the heat-dispersing cool side, the use of the thermoelectric conversion module of the present invention is not limited thereto. For example, in FIG. 1, the top may be the cool side and the bottom may be the hot side.

LIST OF REFERENCE NUMBERS

1 Thermoelectric conversion module
2 Thermoelectric conversion elements
3 First electrodes 4 Second electrodes
6 Element rows
7 Terminal
7a Element arrangement unit
8 Alignment member
8a Notched holes
8b Convex portion
8c Cutout
11 Substrate
31 Element alignment unit
32 Extension
32a Concave portion (to prevent mistaken assembly)
33 Receptor
33a, 33b, 33c Holes
41 Element alignment unit
42 Connector
61-66 First through sixth element rows

What is claimed is:

1. A thermoelectric conversion module comprising:
a substrate;
a plurality of first electrodes;
a plurality of thermoelectric conversion elements each electrically connected at one end to the first electrodes;
a plurality of second electrodes, each electrically connected at another end to the thermoelectric conversion elements; and
connectors that electrically connect the plurality of first electrodes electrically connected to the thermoelectric conversion elements to the second electrodes electrically connected to adjacent thermoelectric conversion elements;
the plurality of thermoelectric conversion elements being either n-type or p-type thermoelectric conversion elements; and
the thermoelectric conversion elements being electrically connected in series,
the first electrodes each having an element alignment unit that electrically contacts one end of the thermoelectric conversion elements and a receptor that receives the connector,
either the first electrodes or the second electrodes being set on the substrate, along the substrate and alternating along two orthogonal axes, an X-axis and a Y-axis,
the thermoelectric conversion elements forming a plurality of element rows on the substrate along the X-axis,
the plurality of element rows aligned along the Y-axis,
the receptors positioned on the X-axis of the element alignment unit within the element rows and configured to accept the connectors of the same shape whether electrically connecting the thermoelectric conversion elements within the element rows or electrically connecting between adjacent element rows,
the first electrodes all having the same shape,
the second electrodes all having the same shape.

2. The thermoelectric conversion module of claim 1, wherein the receptor has a plurality of holes formed therein, a center hole of the plurality of holes accepting the connector within the element rows, and left and right holes accepting the connector between element rows.

3. The thermoelectric conversion module of claim 1, wherein the first electrode has an extension that extends along the substrate from the element alignment unit,
the receptor is provided to the extension, and
the first electrode has a mistaken assembly prevention unit configured of a convexity and a concavity to prevent mistaken setting on the substrate.

4. A method of assembling the thermoelectric conversion module of claim 3, comprising:
setting an alignment unit having a plurality of notched holes corresponding in position and shape to the plurality of first electrodes on the substrate; and
fitting the first electrodes into the notched holes to set the first electrode on the substrate.

* * * * *